(12) United States Patent
Kobayashi

(10) Patent No.: US 8,957,352 B2
(45) Date of Patent: Feb. 17, 2015

(54) HEAT TREATMENT FURNACE AND HEAT TREATMENT APPARATUS

(75) Inventor: Makoto Kobayashi, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 358 days.

(21) Appl. No.: 13/533,291

(22) Filed: Jun. 26, 2012

(65) Prior Publication Data

US 2012/0325804 A1 Dec. 27, 2012

(30) Foreign Application Priority Data

Jun. 27, 2011 (JP) ................... 2011-142102

(51) Int. Cl.
*H05B 3/06* (2006.01)
*H01L 21/67* (2006.01)
*F27D 5/00* (2006.01)

(52) U.S. Cl.
CPC .... *H01L 21/67103* (2013.01); *H01L 21/67109* (2013.01)
USPC ............ 219/531; 219/390; 219/430; 432/242

(58) Field of Classification Search
CPC .................. H01L 21/67109; H01L 21/67103; F26B 23/06; F26B 23/04; F26B 23/10; F27B 17/0025; F27B 17/0016; C30B 25/00; C30B 25/14; C23C 16/481; C23C 16/482
See application file for complete search history.

(56) References Cited

FOREIGN PATENT DOCUMENTS

| JP | 2005-286051 A | 10/2005 |
|---|---|---|
| JP | 2007-88324 A | 4/2007 |
| JP | 2008-263170 A | 10/2008 |
| JP | 2009-68725 A | 4/2009 |

*Primary Examiner* — Shawntina Fuqua
(74) *Attorney, Agent, or Firm* — Nath, Goldberg & Meyer; Jerald L. Meyer

(57) ABSTRACT

Provided is a heat treatment furnace, which includes a processing vessel configured to accommodate at least one object to be processed, a heat insulating member configured to cover a periphery of the processing vessel, and a heating unit configured to be arranged along an inner peripheral surface of the heat insulating member. The heat insulating member includes an inner heat insulating member and an outer heat insulating member formed independently of the inner heat insulating member. The outer heat insulating member contains a finely-powdered compressed silica material, and at least an outer surface thereof is covered with an anti-scattering member configured to prevent the finely-powdered compressed silica material from being scattered.

16 Claims, 11 Drawing Sheets

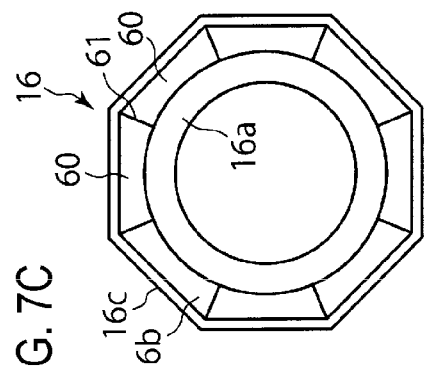
FIG. 7C
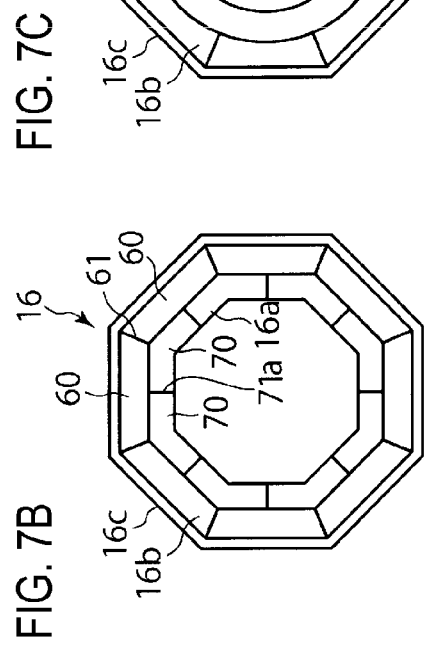
FIG. 7B
FIG. 7A
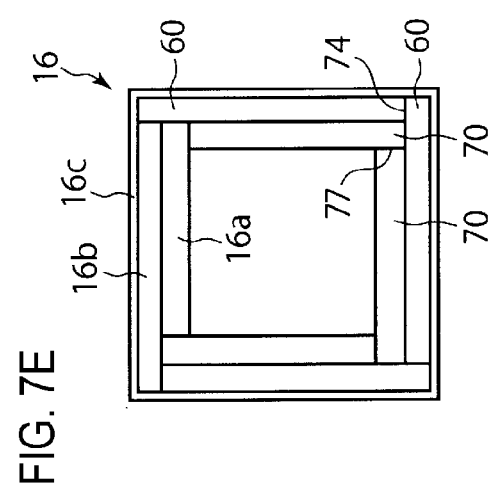
FIG. 7E
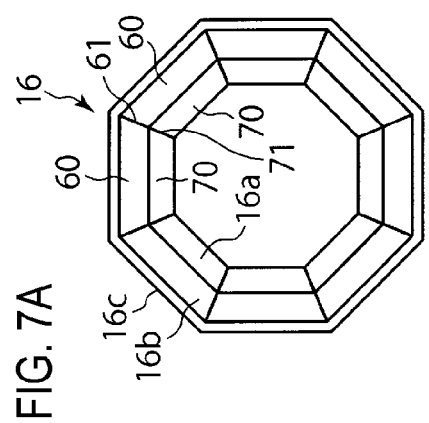
FIG. 7D

HEAT TREATMENT FURNACE AND HEAT TREATMENT APPARATUS

CROSS-REFERENCE TO RELATED APPLICATION

This application claims the benefit of Japanese Patent Application No. 2011-142102, filed on Jun. 27, 2011, in the Japan Patent Office, the disclosure of which is incorporated herein in its entirety by reference.

TECHNICAL FIELD

The present disclosure relates to a heat treatment furnace and a heat treatment apparatus including the same.

BACKGROUND

To manufacture a semiconductor device, various kinds of heat treatment apparatuses are used for performing processes including oxidation, diffusion, and Chemical Vapor Deposition (CVD) to a semiconductor wafer to be processed. A general heat treatment apparatus includes a heat treatment furnace which is mainly equipped with a processing vessel for accommodating semiconductor wafers and performing heat treatment, a cylindrical heat insulating member disposed to cover a periphery of the processing vessel, and a heater arranged along an inner peripheral surface of the heat insulating member to heat the wafers accommodated in the processing vessel. The heater includes heating elements arranged along the inner peripheral surface of the cylindrical heat insulating member.

In a heat treatment apparatus for performing a batch process, the heating elements may include a heating member, which is arranged along an inner wall surface of the cylindrical heat insulating member and supported by a supporting member. The heating elements can heat an inside of the furnace to a high temperature of, for example, about 800 to 1000 degrees C. As the heat insulating member, a member formed by sintering a heat insulating material made of, for example, a ceramic fiber, in a cylindrical shape is used. The heat insulating member reduces a heat quantity lost as radiant heat or conductive heat so as to enhance efficiency in heating. As the supporting member, there is used a ceramic member, for example. The ceramic supporting member supports the heating elements at predetermined pitches, while allowing heat expansion and heat shrinkage of the heat elements.

The heat insulating material of the heat treatment furnace is formed of, for example, an inorganic fiber containing silica, alumina or alumina silicate. In addition, various approaches are employed to prevent heat loss from the heat insulating member.

For example, in order to prevent the heat loss from the heat insulating member, a layer thickness of the heat insulating member may be increased. Unfortunately, to achieve an appropriate prevention of the heat loss, a heat insulating member is required to have a substantially increased thickness. Further, a deteriorated temperature increase/decrease performance may occur because of an increase in heat capacity of the heat insulating member. As such, an increased capacity of heater is required.

Further, a heat insulating vacuum member may be employed to the heat insulating member to enhance an insulation property. Unfortunately, such heat insulating vacuum member using a metal vacuum vessel has a poor heat-resistance, and thus, cannot be used under high temperatures. Moreover, a bulk heat insulating vacuum member results in an increase in weight or an increase in the manufacturing cost.

SUMMARY

The present disclosure provides some embodiments of a heat treatment furnace and a heat treatment apparatus, which are capable of efficiently preventing a heat loss while controlling an increase in total thickness of a heat insulating member.

According to one embodiment of the present disclosure, provided is a heat treatment furnace, which includes a processing vessel configured to accommodate at least one object to be processed, a heat insulating member configured to cover a periphery of the processing vessel, and a heating unit configured to be arranged along an inner peripheral surface of the heat insulating member. The heat insulating member includes an inner heat insulating member and an outer heat insulating member formed independently of the inner heat insulating member. The outer heat insulating member contains a finely-powdered compressed silica material, and at least an outer surface thereof is covered with an anti-scattering member configured to prevent the finely-powdered compressed silica material from being scattered.

According to another embodiment of the present disclosure, provided is a heat treatment apparatus, which includes: a heat treatment furnace having a processing vessel configured to accommodate at least one object to be processed, a lower end of the heat treatment furnace defining a furnace opening; a lid member configured to close/open the furnace opening; a holding unit disposed on the lid member and configured to hold the at least one object to be processed in multiple stages; and an elevating mechanism configured to elevate the lid member and the holding unit in order to close and open the lid member and to carry in and out the processing vessel from the holding unit. The heat treatment furnace includes a heat insulating member configured to cover a periphery of the processing vessel, and a heating unit configured to be arranged along an inner peripheral surface of the heat insulating member. The heat insulating member includes an inner heat insulating member and an outer heat insulating member formed independently of the inner heat insulating member. The outer heat insulating member contains a finely-powdered compressed silica material, and at least an outer surface thereof is covered with an anti-scattering member configured to prevent the finely-powdered compressed silica material from being scattered.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 7A to 7E are transverse sectional views illustrating another modified heat insulating member.

DETAILED DESCRIPTION

Figure 1:
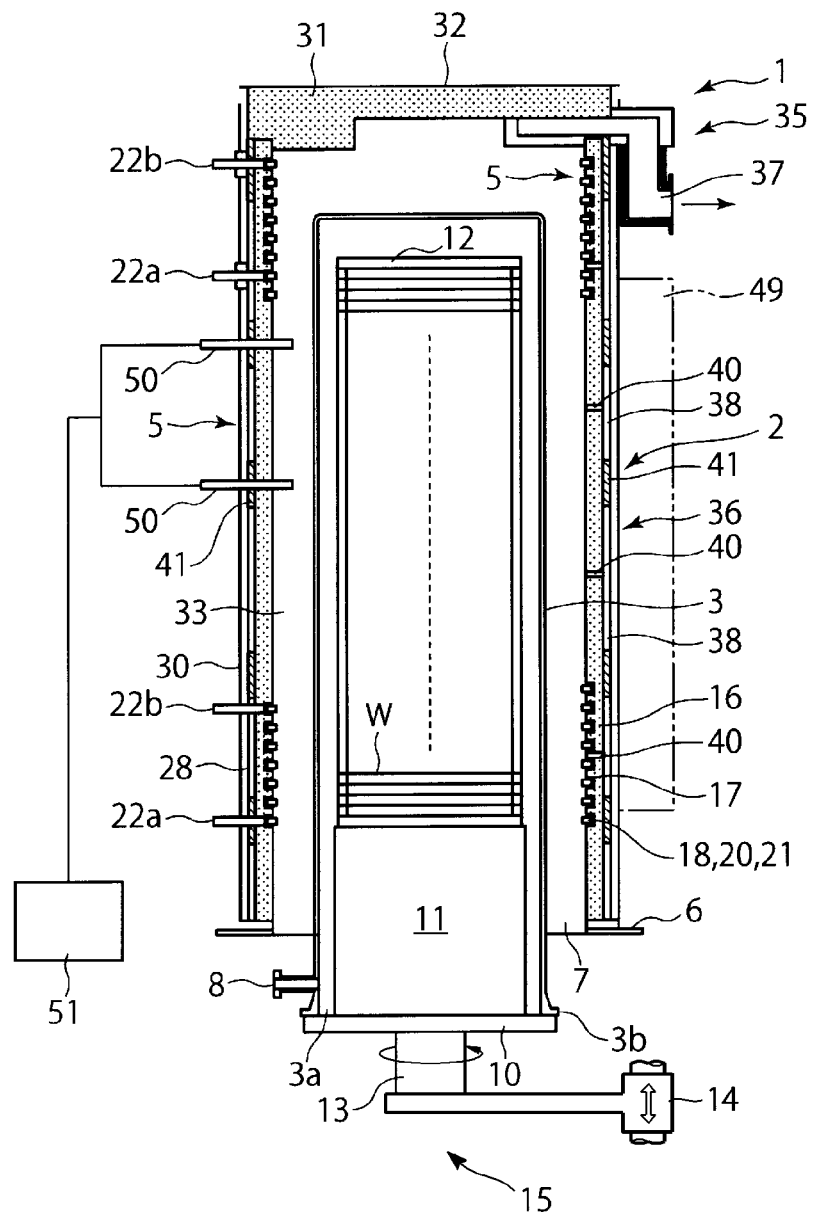
FIG. 1 is a schematic longitudinal sectional view of a heat treatment apparatus according to one embodiment of the present disclosure.
Figure 2:
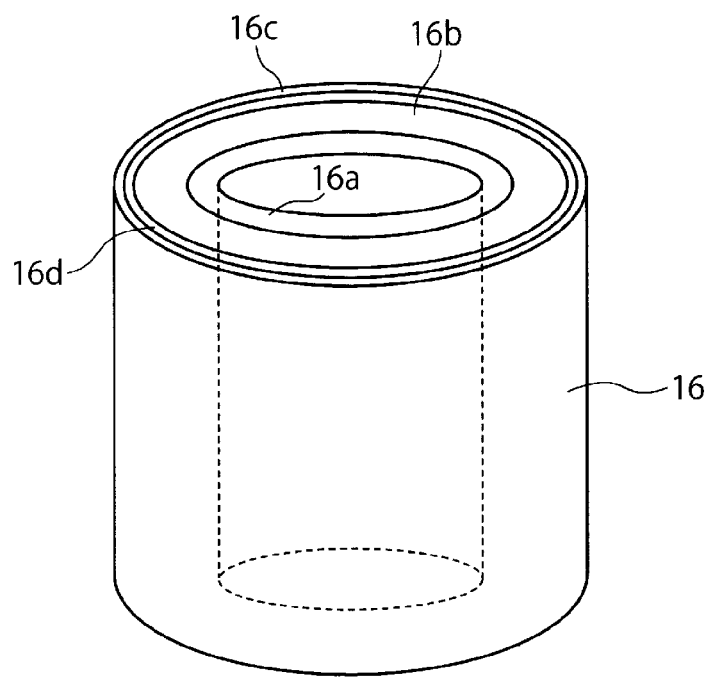
FIG. 2 is a perspective view of a heat insulating member provided in a heat treatment furnace.
Figure 3:
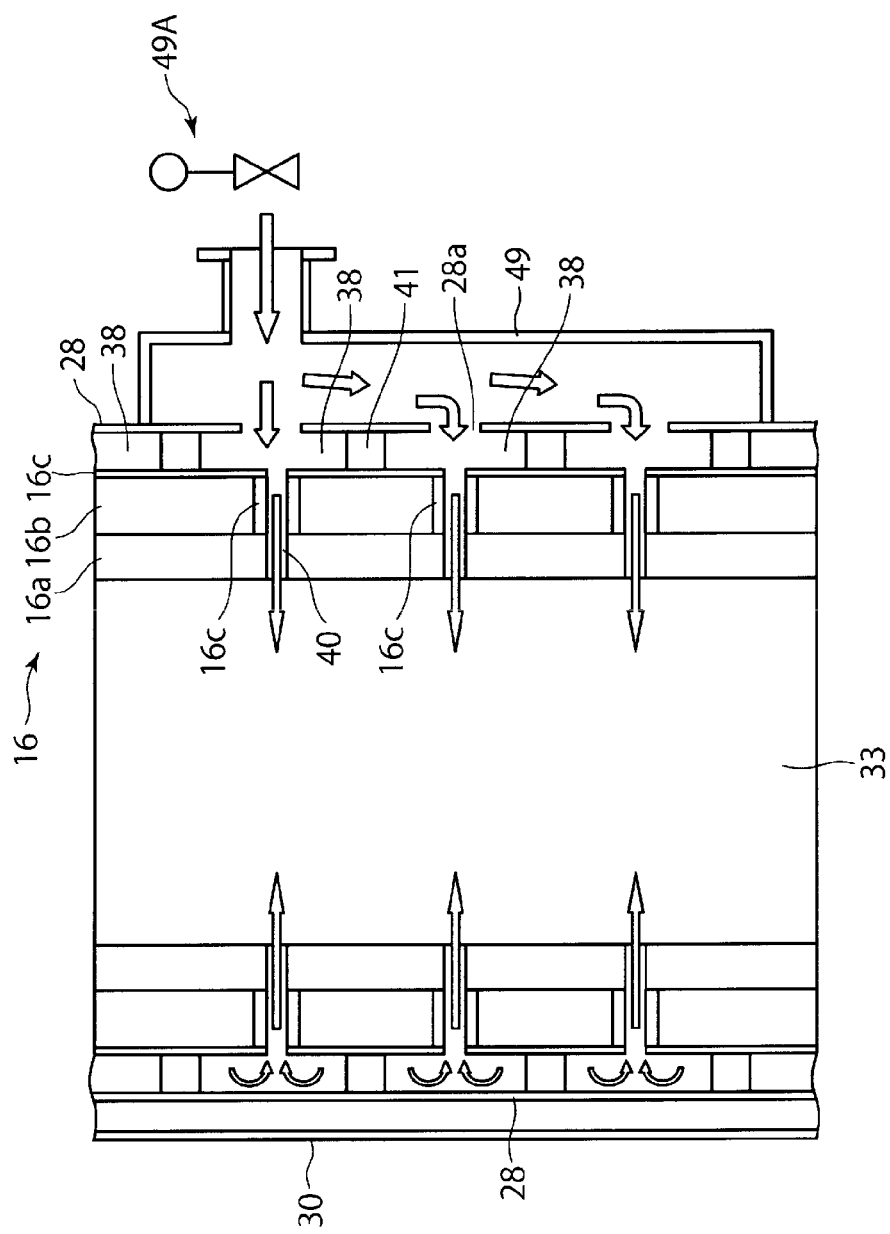
FIG. 3 is a view illustrating a heat insulating member and forcible cooling paths provided in a heat treatment furnace.
Figure 4:
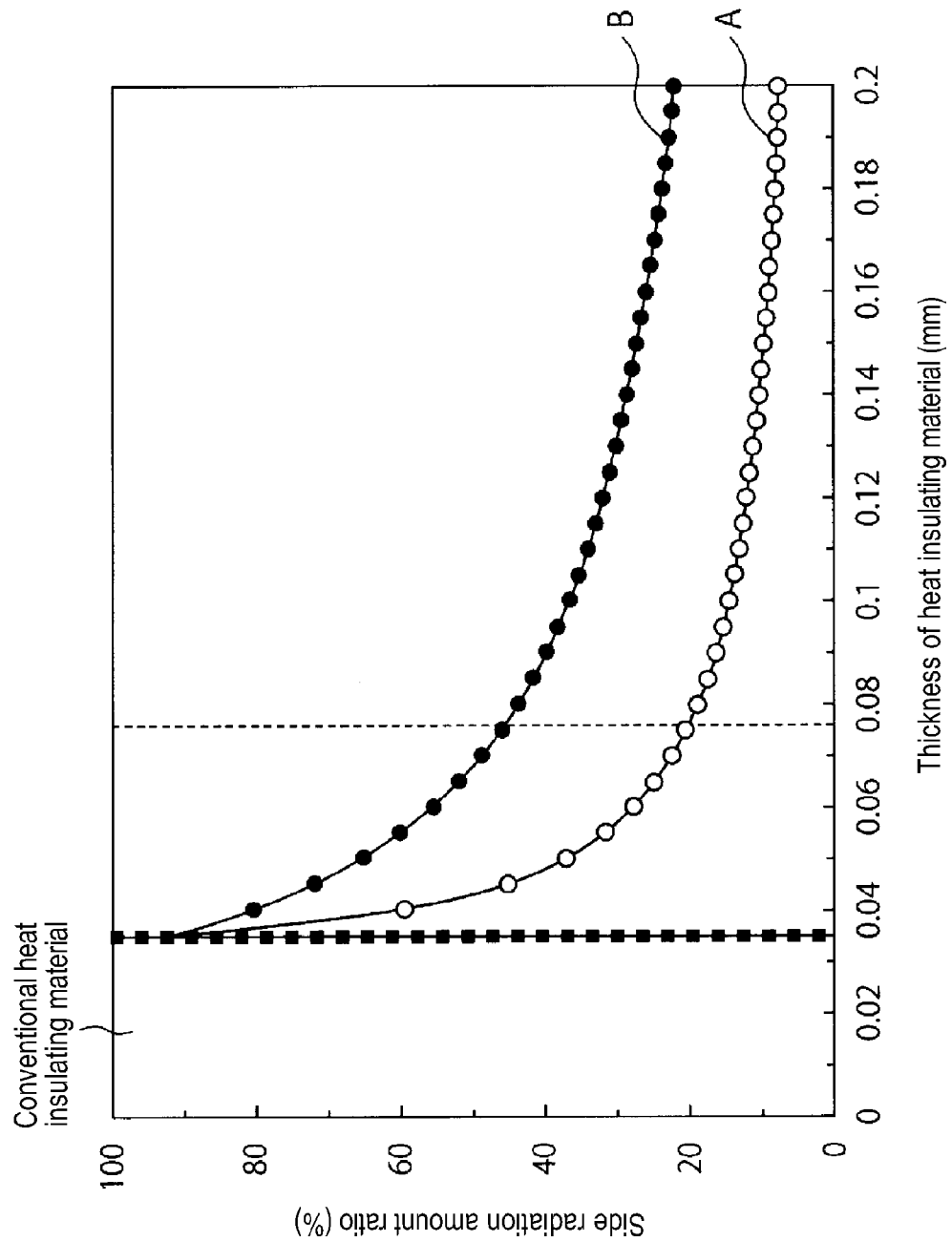
FIG. 4 is a graph illustrating the relationship between a thickness of a heat insulating member and a side radiation amount ratio.

Embodiments will now be described in detail with reference to FIGS. 1 to 4. FIG. 1 is a schematic longitudinal sectional view of a heat treatment apparatus according to one embodiment of the present disclosure. FIG. 2 is a perspective view of a heat insulating member provided in a heat treatment furnace. FIG. 3 is a view illustrating a heat insulating member and forcible cooling paths provided in a heat treatment furnace. FIG. 4 is a graph illustrating the relationship between a thickness of a heat insulating member and a side radiation amount ratio.

In FIG. 1, a vertical-type heat treatment apparatus 1 corresponds to a semiconductor manufacturing apparatus. The heat treatment apparatus 1 includes a vertical-type heat treatment furnace 2 which can accommodate a plurality of objects, for example, semiconductor wafers W, to be processed and perform heat treatment on the plurality of objects. The heat treatment includes oxidation, diffusion, Low Pressure Chemical Vapor Deposition (LPCVD) and the like. The heat treatment furnace 2 includes a processing vessel 3 configured to accommodate the semiconductor wafers W and to perform the heat treatment, a cylindrical heat insulating member 16 covering a periphery of the processing vessel 3, and a heating unit (e.g., heater) 5 disposed along an inner peripheral surface of the heat insulating member 16.

As shown in FIG. 2, the heat insulating member 16 includes an inner heat insulating member 16a made of an inorganic fiber containing, e.g., silica, alumina, or alumina silicate, and an outer heat insulating member 16b formed independently of the inner heat insulating member 16a. The inner heat insulating member 16a is formed of a heat insulating material made of the inorganic fiber as described above, while the outer heat insulating member 16b contains a finely-powdered compressed silica material. An outer surface of the outer heat insulating member 16b is covered with an anti-scattering member 16c with a buffer member 16d interposed therebetween. The anti-scattering member 16c serves to prevent the finely-powdered compressed silica material from being scattered. The following is a detailed description of the heat insulating member 16.

The heat treatment apparatus 1 also includes a base plate 6 on which the heat insulating member 16 is mounted. The base plate 6 is provided with an opening 7 through which the processing vessel 3 is inserted upward from below. The opening 7 is provided with a heat insulating member which covers a gap between the base plate 6 and the processing vessel 3.

The processing vessel 3 is made of quartz, and is formed in an elongated cylindrical shape where an upper end is closed and a lower end is opened to define a furnace opening 3a. An outward flange 3b is formed around the opened end of the processing vessel 3. The flange 3b is supported by the base plate 6 through a flange pressing part (not shown). The processing vessel 3 shown in FIG. 1 may be equipped with, in a lower portion thereof, an introduction port (or, an inlet) 8 for introducing a process gas or an inert gas into the processing vessel 3, and an discharge port (i.e., an outlet) for discharging gas in the processing vessel 3. A gas supply source is connected to the introduction port 8. The discharge port is connected to an exhaust system having a vacuum pump capable of controlling a pressure in the processing vessel 3 to be reduced to, for example, 10 to $10^{-8}$ Torr or so.

A lid member 10 is disposed below the processing vessel 3 for closing/opening the lower end opening (i.e., the furnace opening 3a) of the processing vessel 3. The lid member 10 can be vertically moved by an elevating mechanism 14. On an upper portion of the lid member 10, a heat insulation tube 11, which is used as a heat retaining member for the furnace opening 3a, is disposed. A quartz boat 12 is disposed on an upper portion of the heat insulation tube 11. The quartz boat 12 acts as a holding unit, which is configured to hold a plurality of, e.g., about 100 to 150 wafers W having a diameter of, e.g., 300 mm, at predetermined vertical intervals therebetween. The lid member 10 is provided with a rotating mechanism 13 configured to rotate the boat 12 about the shaft center. The boat 12 is carried out of (or, unloaded from) the processing vessel 3 to a lower loading area 15 by the downward movement of the lid member 10. After the wafers W are replaced, the boat 12 is carried in (or, loaded into) the processing vessel 3 by the upward movement of the lid member 10.

The heater 5 includes a plurality of ribbed shelf sections 17 that are axially (vertically in FIG. 1) formed in multiple stages on an inner circumference surface of the cylindrical heat insulating member 16, and a plurality of heating elements 18 that are arranged along the respective shelf sections 17. In one embodiment, the heat insulating member 16 may be vertically divided into two zones in consideration of the assembly of the heater 5.

The heating elements 18 may be formed by molding a strip-shaped material in a corrugated shape (i.e., a folding work). This corrugated heating elements 18 may be formed of an alloy containing, for example, iron (Fe), chrome (Cr), and aluminum (Al). In some embodiments, each of the heating elements 18 has about 1 to 2 mm in thickness, about 14 to 18 mm in width, about 11 to 15 mm in amplitude of a corrugated portion, and about 28 to 32 mm in pitch of the corrugated portion. In some embodiments, a vertex angle of the corrugated portion of the respective heater element 18 may be set to be about 90 degrees and each vertex portion (referred also to as "convex portion") may be subjected to a rounding work. This arrangement allows the respective heating elements 18 to be displaced within the respective shelf sections 17 of the heat insulating member 16 along a circumferential direction, and enhances an intensity of each rounded portion.

A plurality of pin members 20 are arranged in the heat insulating member 16 at predetermined intervals therebetween. Each of the pin members 20 holds the respective heating element 18 such that the respective heating element 18 is movable in a radial direction of the heater 5, while any dropouts and/or escapes of the respective heating element 18 from the respective shelf section 17 are prevented. A plurality of ring-shaped grooves 21 is formed in multiple stages along an inner circumference surface of the heat insulating member 16 at predetermined axial pitches. The grooves 21 are in a concentric relationship with the heat insulating member 16. In the inner circumference surface of the heat insulating member 16, the shelf sections 17 are consecutively formed to be circumferentially extended between adjacent upper and lower grooves 21. Sufficient clearances are formed between each of upper and lower portions of a respective heater element 18 and a respective groove 21 and between an inner wall of a respective groove 21 and a rear surface of a respective heater element 18 such that the clearances allow a thermal expansion, a heat shrinkage and a diametrical movement of the respective heater element 18 therewithin. Further, during a forcible cooling process, a cooling medium is applied to the rear surface of the respective heater element 18 through the respective clearance, thus allowing the respective heating element 18 to be efficiently cooled. Further, the heating elements 18 arranged along the inner peripheral surface of the heat insulating member 16 may be longitudinally segmented into a plurality of (e.g., five) sections.

In one embodiment, although the segmented heat elements 18 may be annularly formed along the respective shelf sections 17 or the respective grooves 21 of the heat insulating member 16, the present disclosure is not limited thereto. Alternatively, in consideration of the assembly of the heating elements 18, the heating elements 18 may be formed in a semicircle (or an arc) shape, corresponding to the heat insulating member 16 which is halved, i.e., longitudinally divided into two. The heating elements 18 having the segmented structure as above may have a connection pattern (or line segment) in which both ends of the heater element 18 in each step are folded to be radially projected outward, such that ends of the adjacent upper and lower heating elements 18, i.e., a dead end of a first step and a start end of a second step, are connected to each other by a first connection plate (not shown), and that a dead end of the second step and a start end of a third step are sequentially connected to each other by a second connection plate (not shown). The connection pattern of the heating elements 18 is not limited to the above examples.

Both ends of each of the heating elements 18 longitudinally segmented are connected to terminal plates 22a and 22b which is coupled with an external power supply (not shown), respectively. The configuration of the heating elements 18 constituting the heater 5 is not limited to the above and various configurations may be employed. Further, although in the above the heating elements 18 are described to be inserted into the respective grooves 21 formed on the heat insulating member 16 and be supported by the respective shelf sections 17 and be held by the respective pin members 20, the present disclosure is not limited thereto. Alternatively, the heating elements 18 may be supported by another various structures.

A temperature sensor 50 is installed in a space 33 defined between the heat insulating member 16 and the processing vessel 3. A signal from the temperature sensor 50 is provided to a controller 51. In response to the signal from the temperature sensor 50, the controller 51 drives a power supply (not shown) to supply a predetermined electric power to the heating elements 18. Thus, the temperature within the space 33 is controlled.

In order to maintain the shape of the heat insulating member 16 and to reinforce the heat insulating member 16, as shown in FIGS. 1 and 3, an outer circumference surface of the anti-scattering member 16c of the heat insulating member 16 may be covered with an outer shell 28 made of a metal such as a stainless steel. It will be appreciated that other metal materials may be possible. In some embodiments, an outer circumference surface of the outer shell 28 may be covered with a water cooling jacket 30 so as to restrain a heat influence of the heater 5 on the exterior. In addition thereto, a top portion of the heat insulating member 16 is covered with an upper heat insulating member 31, and further, a stainless top plate 32 covering also a top portion (i.e., upper end portion) of the outer shell 28 is disposed on an upper portion of the upper heat insulating member 31.

In order that a temperature of the wafer W after heat treatment is quickly lowered so as to accelerate a process or to improve a throughput, the heater 5 is equipped with a heat discharging system 35 configured to discharge outward an atmosphere in the space 33 between the heat insulating member 16 and the processing vessel 3, and a forcible cooling unit 36 configured to forcibly cool the processing vessel 3 by introducing a cooling medium into the space 33. The heat discharging system 35 is mainly composed of an outlet 37 formed in an upper portion of the heater 5 and a heat discharging pipe (not shown) for connecting the outlet 37 and a factory air-discharging system (not shown). The heat discharging pipe is provided with an air-discharging blower (not shown) and a heat exchanger (not shown).

In one embodiment, air, inert gas (e.g., nitrogen gas) or water may be used as the cooling medium.

The forcible cooling unit 36 includes a plurality of annular paths 38 that is formed between the anti-scattering member 16c of the heat insulating member 16 and the outer shell 28 in a height direction, and a plurality of blowing holes 40 that are formed in the heat insulating member 16, through which the cooling medium is blown from the respective annular paths 38 into an inside of the heat insulating member 16 in a horizontal and radially inclined diametrical direction so as to generate whirls in the space 33 in a circumferential direction thereof. Each of the plurality of annular paths 38 may be formed by attaching a strip-like or annular adiabatic partition member 41 to an outer circumference of the heat insulating member 16. Each of the plurality of blowing holes 40, which is formed to correspond to the respective annular path 38 as described above, may be formed to diametrically pass through the respective shelf section 17 placed between adjacent upper and lower heating elements 18 in the heat insulating member 16. With this arrangement, the cooling medium can be spouted into the space 33 without interference with heating elements 18.

Figure 12A:
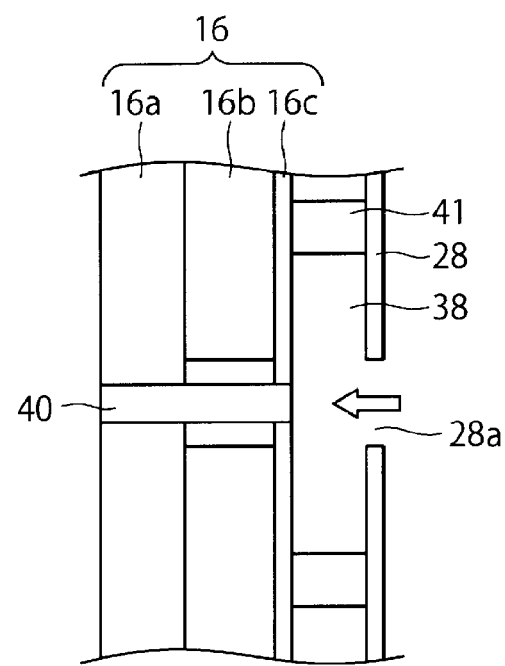
FIG. 12A is a view illustrating an arrangement in which an annular path is formed between an outer heat insulating member and an outer shell.

As shown in FIGS. 1, 3 and 12A, a single common supply duct 49 for distributing a cooling medium into the respective annular paths 38 is arranged on an outer circumference surface of the outer shell 28 along a height direction thereof. On the outer shell 28, a plurality of communication holes 28a are formed to communicate the inside of the single common supply duct 49 and the respective annular paths 38. A cooling medium supply source (not shown), e.g., a ventilator, that sucks the cooling medium and pressure-feeds the same, is connected to the single common feeding duct 49 via a switching valve 49A.

According to this embodiment, the switching valve 49A is connected to the single common supply duct 49 connected to the plurality of annular paths 38, which makes it possible to collectively control a flow rate of the cooling medium that flows through the annular paths 38. In some embodiments, the single common supply duct 49 may be divided corresponding to each of the annular paths 38, and a plurality of switching valves may be connected to the respective divided sections of the supply duct 49 corresponding to the respective annular paths 38. With this arrangement, it is possible to individually control a flow rate of the cooling medium that flows through the respective annular paths 38.

The following is a description on the heat insulating member 16. As shown in FIGS. 1 and 2, the heat insulating member 16 includes the inner heat insulating member 16a made of alumina or silica, the outer heat insulating member 16b containing a finely-powdered compressed silica material, and the anti-scattering member 16c formed on the outer surface of the outer heat insulating member 16b with the buffer member 16d interposed therebetween.

In particular, the outer heat insulating member 16b contains at least the finely-powdered compressed silica material to obtain a high insulating property. This prevents the total thickness of the heat insulating member 16 from being increased, thereby improving a heat insulation property of the heat insulating member 16, compared to a case where the heat insulating member 16 is constituted by only the inner heat insulating member 16a made of a general heat insulating material.

In addition, the inner surface of the outer heat insulating member 16b is covered with the inner heat insulating member 16a made of a general heat insulating material, and the outer surface thereof is covered with the anti-scattering member 16c with the buffer member 16d interposed therebetween. This arrangement prevents the finely-powdered compressed silica material of the outer heat insulating member 16b, which tends to be scattered, from being scattered from both the inner and outer surfaces of the outer heat insulating member 16b to the exterior.

Although in the above embodiment, the outer heat insulating member 16b is described to contain at least the finely-powdered compressed silica material, the present disclosure is not limited thereto. Alternatively, a finely-powdered silicon carbide or a finely-powdered titania may be added to the finely-powdered compressed silica material. In this case, the outer heat insulating member 16b, which contains at least the finely-powdered silica material, may be obtained by compressing a material obtained by adding the finely-powdered silicon carbide or the finely-powdered titania to the finely-powdered silica material.

The following is a detailed description of a structure of the outer heat insulating member 16b.

<Structure and Component>

There is provided a non-closing cell structure having a size of 0.1 micrometer or lower, which is a ceramic powder compact obtained by reinforcing with an inorganic fiber.

The non-closing cell structure has $SiO_2$ with a powder diameter of about 5 to 30 nm as a main component. An infrared-impermeable material including SiC, $ZrO_2$, $TiO_2$, $Al_2O_3$ or the like may be added to $SiO_2$ as desired or needed in order to further prevent an infrared transmission.

<Heat Conduction Characteristics>

<Heat Conduction Characteristics of Solid>

An extremely small size of material is used, and thus, a significantly small area of contact portion is generated. This results in low heat conductivity.

<Heat Conduction Characteristics of Gas>

A formed cell has a size of 0.1 micrometer, which is lower than that of an air mean free path. This prevents an intermolecular collision, thereby resulting in low heat conductivity.

<Infrared Transmission Characteristics>

An infrared-impermeable material including SiC, $ZrO_2$, $TiO_2$, $Al_2O_3$, or the like is added to block radiant heat, thereby minimizing an infrared transmission. With this configuration, a relatively better heat insulation property falling below a heat conductivity of quiescent air is obtained. Herein, upon comparison of a heat conductivity of the finely-powdered compressed silica material with the inorganic fiber such as alumina, silica, etc. and the quiescent air, the following Table 1 may be obtained.

TABLE 1

|  | 400 degrees C. | [Unit: W/m · k]<br>600 degrees C. |
|---|---|---|
| Finely-powdered compressed silica material | 0.03 | 0.04 |
| Inorganic fiber such as alumina, silica, etc | 0.10 | 0.13 |
| Quiescent air | 0.05 | 0.06 |

Further, the buffer member 16d disposed on the outer surface of the outer heat insulating member 16b may be disposed to allow a thermal expansion. In some embodiments, the buffer member 16d may include a member such as a bracket, obtained by stacking a textile ceramic fiber in a bracket shape, which is superior in flexibility and heat resistance. Alternatively, the anti-scattering member 16c may be directly disposed on the outer surface of the outer heat insulating member 16b without interposing the buffer member 16d therebetween. In another embodiment, an air layer may be formed between the outer heat insulating member 16b and the anti-scattering member 16c in place of the buffer member 16d.

The anti-scattering member 16c, which prevents scatter of the finely-powdered compressed silica material, may include a member made of a metal such as stainless steel. Alternatively, the anti-scattering member 16c may include a ceramic-made anti-scattering member such as quartz or alumina, or a member made of an inorganic fiber containing silica, alumina or the like, which is similar to that of the inner heat insulating member 16a.

As described above, the plurality of annular paths 38 are formed between the anti-scattering member 16c of the heat insulating member 16 and the outer shell 28 in a height direction, and the plurality of blowing holes 40 is formed to penetrate through the inner heat insulating member 16a, the outer heat insulating member 16b and the anti-scattering member 16c of the heat insulating member 16, so that the annular paths 38 and the space 33 are communicated to each other (see FIG. 3). In one embodiment, in the outer heat insulating member 16b, regions corresponding to the respective blowing holes 40 are covered with the anti-scattering member 16c.

This configuration prevents the outer heat insulating member 16b from being exposed to the respective blowing holes 40, which makes it possible to prevent the finely-powdered compressed silica material of the outer heat insulating member 16b from being scattered into the respective blowing holes 40 and sequentially into the space 33.

Figure 12B:
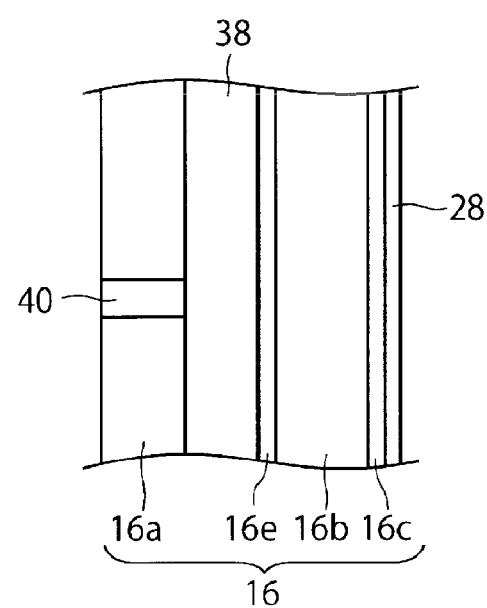
FIG. 12B is a view illustrating an arrangement in which an annular path is formed between an inner heat insulating member and an outer heat insulating member.

Although in FIGS. 3 and 12A, the annular paths 38 are shown to be formed between the anti-scattering member 16c of the heat insulating member 16 and the outer shell 28, the present disclosure is not limited thereto. Alternatively, a space may be formed between the inner heat insulating member 16a and the outer heat insulating member 16b of the heat insulating member 16 such that the space is used as the annular paths 38, as shown in FIG. 12B.

To achieve the above, it is necessary to cover the outer surface of the outer heat insulating member 16b with the anti-scattering member 16c and also cover the inner surface thereof with an anti-scattering member 16e. In this case, the blowing holes 40 may be formed to penetrate through the inner heat insulating member 16a.

According to the present disclosure as described above, the heat insulating member 16 includes the inner heat insulating member 16a made of a general heat insulating material, the outer heat insulating member 16b made of a finely-powdered compressed silica material, and the anti-scattering member 16c that is formed on the outer surface of the outer heat insulating member 16b with the buffer member 16d interposed therebetween and prevents scatter of the finely-powdered compressed silica material. With this configuration, the use of the heat insulation property of the outer heat insulating member 16b can improve the overall heat insulation property of the heat insulating member 16 while controlling the thickness of the heat insulating member 16.

FIG. 4 is a graph illustrating the relationship between a thickness of a heat insulating member and a side radiation amount ratio, with the thickness of the heat insulating member as the horizontal axis and the side radiation amount ratio as the vertical axis. Herein, the side radiation amount ratio represents a value measured based on a difference in temperature between the outer and inner surfaces of the heat insulating member. Specifically, in FIG. 4, a side radiation amount ratio A represents a first case where a finely-powdered compressed silica material is formed on an heat insulating member (corresponding to the inner heat insulating member 16a) made of a conventional material with a thickness of 35 mm, according to the present disclosure. Further, a side radiation amount ratio B represents a second case where a conventional heat insulating material is further formed on an heat insulating member (corresponding to the inner heat insulating member 16a) made of a conventional material with a thickness of 35 mm so that the thickness of the heat insulating member made of the conventional heat insulating material is merely increased, according to a comparative example.

As shown in FIG. 4, the first case illustrates that the side radiation amount ratio A drastically increases until the thickness of the finely-powdered compressed silica material reaches up to 40 mm, thereby resulting in an improved heat insulation property of the heat insulating member 16. In this case, the finely-powdered compressed silica material is formed on the heat insulating member made of the conventional material with the thickness of 35 mm. Meanwhile, even if the thickness of the finely-powdered compressed silica material increases over 40 mm, a variation in the side radiation amount ratio A is small. Accordingly, in one embodiment, the thickness of the finely-powdered compressed silica material may set to be in the order of 40 mm.

Upon setting the thickness of the finely-powdered compressed silica material to be 40 mm or so, the total thickness of the heat insulating member 16 is 75 mm.

In FIG. 4, the comparative example illustrates the side radiation amount ratio B of 45% when the total thickness of the heat insulating member made of the conventional material is set to be 75 mm, while the present disclosure illustrates the side radiation amount ratio A of 20% when the thickness of the finely-powdered compressed silica material is set to be 40 mm and the total thickness of the heat insulating member 16 is set to be 75 mm. Therefore, the present disclosure is capable of drastically decreasing the side radiation amount ratio.

Further, according to the present disclosure, since the outer heat insulating member 16b containing the finely-powdered compressed silica material is covered with the anti-scattering member 16c, the finely-powdered compressed silica material is not scattered to the exterior.

<Modified Heat Insulating Member and Elements Thereof>

A modified heat insulating member and elements thereof will be described in detail with reference to FIGS. 5A to 11.

In the following description of the modified heat insulating member and elements thereof in FIGS. 5A to 11, same reference numerals will be used to describe the configurations that are equal or similar to the aforementioned embodiments shown in FIGS. 1 to 4. Detailed descriptions for the aforementioned same or similar configurations will be omitted.

Figure 5A:
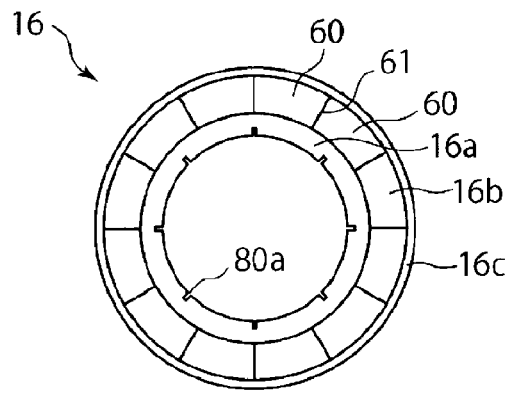
FIGS. 5A to 5C are views illustrating a modified heat insulating member.
Figure 5B:
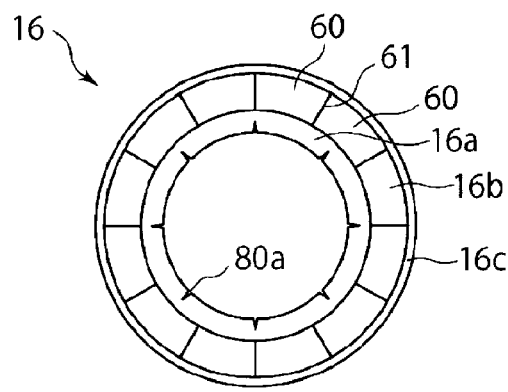
Figure 5C:
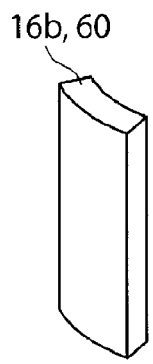

As shown in FIGS. 5A to 5C, a heat insulating member 16 includes an inner heat insulating member 16a made of a conventional material, an outer heat insulating member 16b containing a finely-powdered compressed silica material, and an anti-scattering member 16c.

Among these, the outer heat insulating member 16b includes a plurality of longitudinally divided sections 60, which are adjacent to each other with a respective radially-extended boundary plane 61 interposed therebetween. On the inner peripheral surface of the inner heat insulating member 16a is formed a plurality of longitudinally extended slits 80 having a rectangular cross section, as shown in FIG. 5A. With this configuration, although the outer heat insulating member 16b and the inner heat insulating member 16a thermally expand or shrink during heating and cooling processes, such thermal expansion and shrinkage may be allowed by the plurality of boundary planes 61 of the outer heat insulating member 16b and the plurality of slits 80.

In some embodiments, each of the divided sections 60 of the outer heat insulating member 16b may be obtained by cutting a raw material made of a finely-powdered compressed silica material and having a certain level of thickness into rectangles, as shown in FIG. 5C.

While in the above, the plurality of slits 80 having the rectangular cross section are described to be formed on the inner peripheral surface of the inner heat insulating member 16a, the present disclosure is not limited thereto. Alternatively, a plurality of slits 80a having a triangle cross section may be formed on the inner peripheral surface of the inner heat insulating member 16a, as shown in FIG. 5B.

A modified outer heat insulating member 16b will be described with reference to FIGS. 6A to 6E.

Figure 6A:
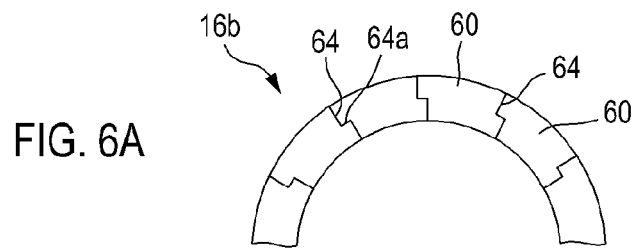
FIGS. 6A to 6E are transverse sectional views illustrating a modified outer heat insulating member of a heat insulating member.

As shown in FIG. 6A, the outer heat insulating member 16b includes a plurality of longitudinally divided sections 60, which are adjacent to each other with a respective radially-extended boundary plane 64 interposed therebetween. In FIG. 6A, each of the boundary planes 64 has a stepped portion 64a as seen from a transverse section. This configuration allows adjacent divided sections 60 to be engaged with each other at a respective stepped portion 64a.

Figure 6B:
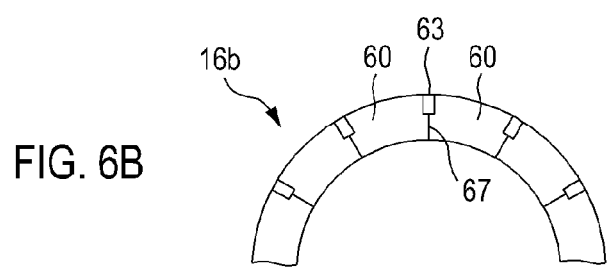

As shown in FIG. 6B, the outer heat insulating member 16b includes a plurality of longitudinally divided sections 60, which are adjacent to each other with a respective radially-extended boundary plane 67 interposed therebetween. In some embodiments, each periphery of the boundary planes 67 is provided with a filling material 63 made of the same material (i.e., the finely-powdered compressed silica material) as that of the outer heat insulating member 16b. This configuration blocks heat passing through the respective boundary planes 67 by the respective filling materials 63 even if the adjacent divided sections 60 are slightly spaced from each other, thereby improving a heat insulation property of the outer heat insulating member 16b.

Figure 6C:
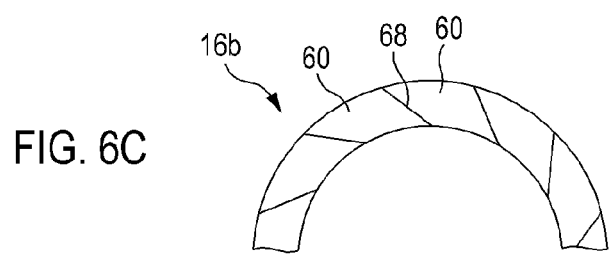

Further, as shown in FIG. 6C, an outer heat insulating member 16b includes a plurality of longitudinally divided sections 60, which are adjacent to each other with a respective radially-inclined boundary plane 68 interposed therebetween. This configuration reduces heat radiating from the inner surface to the outer surface of the outer heat insulating member 16b even if the adjacent divided sections 60 are slightly spaced from each other.

Figure 6D:
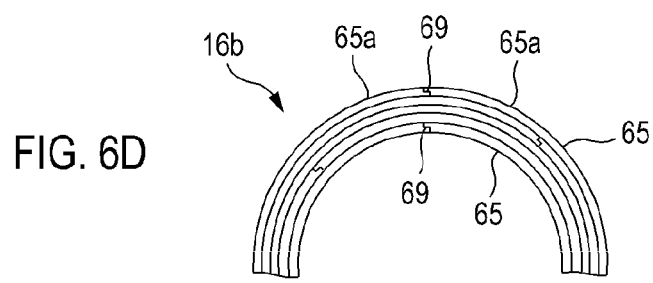
Figure 6E:
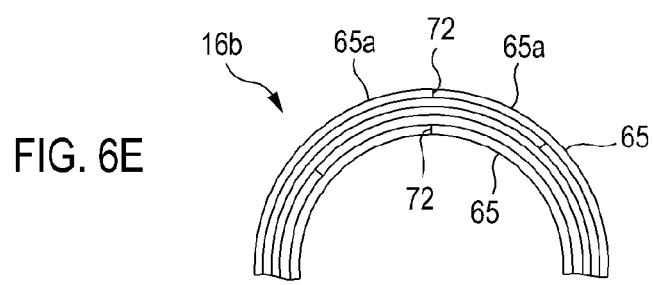

Further, in some embodiments, as shown in FIGS. 6D and 6E, the outer heat insulating member 16b may include a plurality of cylindrical thin plates 65, 65, which are sequentially disposed from the inner surface to the outer surface of the outer heat insulating member 16b in a multilayer shape. In this case, each of the thin plates 65 may be formed of a finely-powdered compressed silica material.

Further, in FIG. 6D, each of the cylindrical thin plates 65 includes a plurality of longitudinally divided sections 65a, which are adjacent to each other with a respective stepped boundary plane 69 interposed therebetween. Each of the divided sections 65a may be formed by bending a flat-shaped raw material made of a finely-powdered compressed silica material. This configuration allows the adjacent divided sections 65a to be engaged with each other at the respective stepped portion in the stepped boundary plane 69. Also, the boundary plane 69 of an inlying thin plate 65 and that of an outlying thin plate 65 are out of position in a circumferential direction. This configuration reduces heat radiating from the inner surface to the outer surface of the outer heat insulating member 16b. Further, instead of forming the stepped boundary plane 69 in each of the thin plates 65 as shown in FIG. 6D, a plurality of linear boundary planes 72 may be radially formed in the thin plates 65, as shown in FIG. 6E.

Another modified heat insulating member 16 will be described with reference to FIGS. 7A to 7E.

As shown in FIG. 7A, the heat insulating member 16 includes an inner heat insulating member 16a made of a conventional heat insulating material, an outer heat insulating member 16b made of a finely-powdered compressed silica material, and an anti-scattering member 16c covering the outer surface of the outer heat insulating member 16b. Among these, the inner heat insulating member 16a includes a plurality of longitudinally divided sections 70, which are adjacent to each other with a respective boundary plane 71 interposed therebetween. The outer heat insulating member 16b includes a plurality of longitudinally divided sections 60, which are adjacent to each other with a respective boundary plane 61 interposed therebetween. For example, the inner heat insulating member 16a, the outer heat insulating member 16b and the anti-scattering member 16c may have an octagonal cross section, respectively.

As shown in FIG. 7B, the heat insulating member 16 includes an inner heat insulating member 16a made of a conventional heat insulating material, an outer heat insulating member 16b made of a finely-powdered compressed silica material, and an anti-scattering member 16c covering the outer surface of the outer heat insulating member 16b. In particular, the inner heat insulating member 16a includes a plurality of longitudinally divided sections 70, which are adjacent to each other with a respective boundary plane 71a interposed therebetween. The outer heat insulating member 16b includes a plurality of longitudinally divided sections 60, which are adjacent to each other with a respective boundary plane 61 interposed therebetween.

Further, all of the inner heat insulating member 16a, the outer heat insulating member 16b and the anti-scattering member 16c may have a polyangular (e.g., octagonal) tubular shape. To design this shape, cross sections of the inner heat insulating member 16a, the outer heat insulating member 16b and the anti-scattering member 16c may be formed in a polygonal shape, e.g., an octagonal shape. Further, the boundary plane 71a of the inner heat insulating member 16a and the boundary plane 61 of the outer heat insulating member 16b are out of position in a circumferential direction. This configuration reduces heat radiating from the inner surface to the outer surface of the heat insulating member 16.

As shown in FIG. 7C, the heat insulating member 16 includes an inner heat insulating member 16a made of a conventional heat insulating material, an outer heat insulating member 16b made of a finely-powdered compressed silica material, and an anti-scattering member 16c covering the outer surface of the outer heat insulating member 16b. In particular, the outer heat insulating member 16b includes a plurality of longitudinally divided sections 60, which are adjacent to each other with a respective boundary plane 61 interposed therebetween. Further, all of the inner heat insulating member 16a may have a cylindrical cross section, and the outer heat insulating member 16b and the anti-scattering member 16c may have a polyangular (e.g., octagonal) cross section, respectively. In addition, the inner surface of the outer heat insulating member 16b may have a circular cross section.

As shown in FIG. 7D, the heat insulating member 16 includes an inner heat insulating member 16a made of a conventional heat insulating material, an outer heat insulating member 16b made of a finely-powdered compressed silica material, and an anti-scattering member 16c covering the outer surface of the outer heat insulating member 16b. In particular, the inner heat insulating member 16a includes a plurality of longitudinally divided sections 70, which are adjacent to each other with a respective boundary plane 73 interposed therebetween. The outer heat insulating member 16b includes a plurality of longitudinally divided sections 60, which are adjacent to each other with a respective boundary plane 61 interposed therebetween.

In one embodiment, all of the outer heat insulating member 16b and the anti-scattering member 16c may have a polyangular (e.g., octagonal) cross section. Further, the outer surface of the inner heat insulating member 16a may have a polyangular (e.g., octagonal) cross section, and the inner surface thereof may have a circular cross section. Further, the boundary plane 73 of the inner heat insulating member 16a and the boundary plane 61 of the outer heat insulating member 16b are out of position in a circumferential direction. This configuration reduces heat radiating from the inner surface to the outer surface of the heat insulating member 16.

As shown in FIG. 7E, the heat insulating member 16 includes an inner heat insulating member 16a made of a conventional heat insulating material, an outer heat insulating member 16b made of a finely-powdered compressed silica material, and an anti-scattering member 16c covering the outer surface of the outer heat insulating member 16b. In particular, the inner heat insulating member 16a includes a plurality of longitudinally divided sections 70, which are adjacent to each other with a respective boundary plane 77 interposed therebetween. The outer heat insulating member 16b includes a plurality of longitudinally divided sections 60, which are adjacent to each other with a respective boundary plane 74 interposed therebetween. Further, the inner heat insulating member 16a, the outer heat insulating member 16b and the anti-scattering member 16c may have a polyangular (e.g., quadrangular) cross section.

Yet another modified heat insulating member 16 will be described with reference to FIGS. 8A to 8D.

Figure 8A:
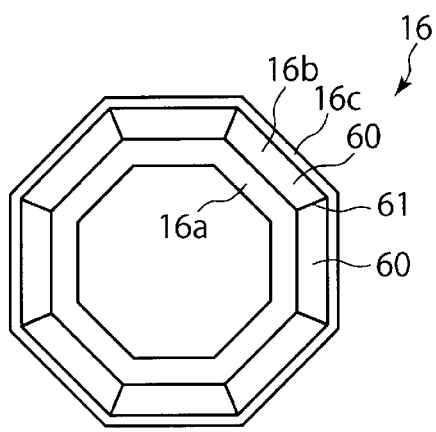
FIGS. 8A to 8D are transverse sectional views illustrating yet another modified heat insulating member.

As shown in FIG. 8A, the heat insulating member 16 includes an inner heat insulating member 16a made of a conventional heat insulating material, an outer heat insulating member 16b made of a finely-powdered compressed silica material, and an anti-scattering member 16c covering the outer surface of the outer heat insulating member 16b. In particular, the outer heat insulating member 16b includes a plurality of longitudinally divided sections 60, which are adjacent to each other with a respective boundary plane 61 interposed therebetween. Further, the inner heat insulating member 16a, the outer heat insulating member 16b and the anti-scattering member 16c may have a polyangular (e.g., octagonal) cross section.

Figure 8B:
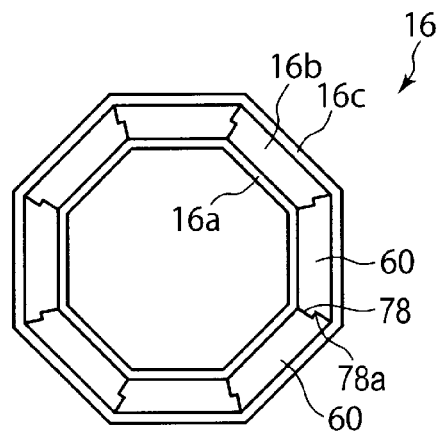

As shown in FIG. 8B, the heat insulating member 16 includes an inner heat insulating member 16a made of a conventional heat insulating material, an outer heat insulating member 16b made of a finely-powdered compressed silica material, and an anti-scattering member 16c covering the outer surface of the outer heat insulating member 16b. In particular, the outer heat insulating member 16b includes a plurality of longitudinally divided sections 60, 0 which are adjacent to each other with a respective boundary plane 78 having a stepped portion 78a interposed therebetween. Further, the inner heat insulating member 16a, the outer heat insulating member 16b and the anti-scattering member 16c may have a polyangular (e.g., octagonal) cross section.

Figure 8C:
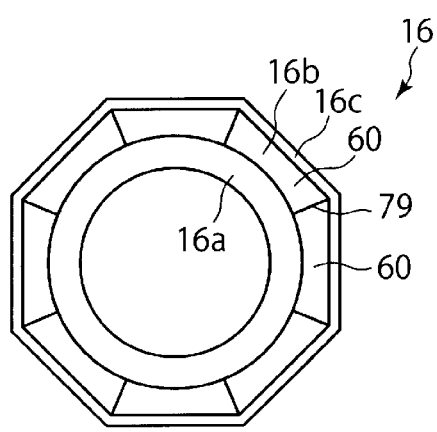

As shown in FIG. 8C, the heat insulating member 16 includes an inner heat insulating member 16a made of a conventional heat insulating material, an outer heat insulating member 16b made of a finely-powdered compressed silica material, and an anti-scattering member 16c covering the outer surface of the outer heat insulating member 16b. In particular, the outer heat insulating member 16b includes a plurality of longitudinally divided sections 60, which are adjacent to each other with a respective boundary plane 79 interposed therebetween. Further, the inner heat insulating member 16a may have a cylindrical cross section, and the outer heat insulating member 16b and the anti-scattering member 16c may have a polyangular (e.g., octagonal) cross section, respectively. In addition, the inner surface of the outer heat insulating member 16b may have a circular cross section.

Figure 8D:
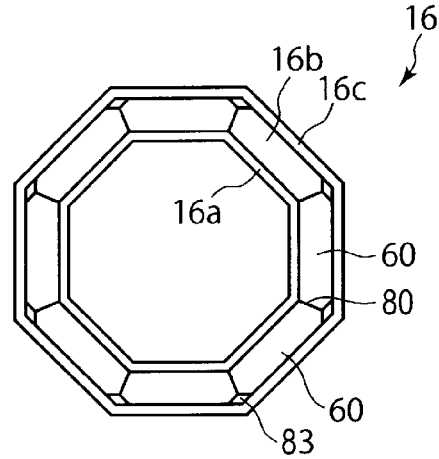

As shown in FIG. 8D, the heat insulating member 16 includes an inner heat insulating member 16a made of a conventional heat insulating material, an outer heat insulating member 16b made of a finely-powdered compressed silica material, and an anti-scattering member 16c covering the outer surface of the outer heat insulating member 16b. In particular, the outer heat insulating member 16b includes a plurality of longitudinally divided sections 60, which are adjacent to each other with a respective boundary plane 80 interposed therebetween. Further, a plurality of filling materials 83 made of a finely-powdered compressed silica material are formed in a periphery of the respective boundary planes 80 of the outer heat insulating member 16b. Further, the inner heat insulating member 16a, the outer heat insulating member 16b and the anti-scattering member 16c may have a polyangular (e.g., octagonal) cross section.

Figure 9A:
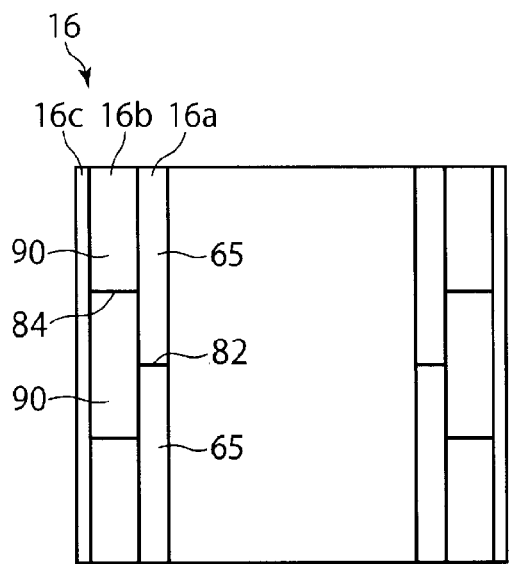
FIGS. 9A and 9B are transverse sectional views illustrating yet another modified heat insulating member.
Figure 9B:
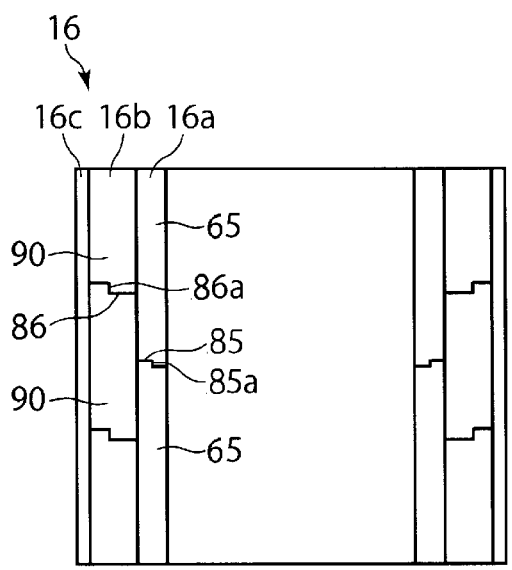

Still yet other modified heat insulating member 16 will be described with reference to FIGS. 9A and 9B. FIGS. 9A and 9B are longitudinal sectional views of the heat insulating member 16, respectively.

As shown in FIG. 9A, the heat insulating member 16 includes an inner heat insulating member 16a made of a conventional heat insulating material, an outer heat insulating member 16b made of a finely-powdered compressed silica material, and an anti-scattering member 16c covering the outer surface of the outer heat insulating member 16b. In particular, the inner heat insulating member 16a includes a plurality of laterally divided sections 65, which are stacked in a multiple step with a respective boundary plane 82 interposed therebetween. The outer heat insulating member 16b includes a plurality of laterally divided sections 90, which are stacked in a multiple step with a respective boundary plane 84 interposed therebetween.

As shown in FIG. 9B, the heat insulating member 16 includes an inner heat insulating member 16a made of a conventional heat insulating material, an outer heat insulating member 16b made of a finely-powdered compressed silica material, and an anti-scattering member 16c covering the outer surface of the outer heat insulating member 16b. In particular, the inner heat insulating member 16a includes a plurality of laterally divided sections 65, which are stacked in a multiple step with a respective boundary plane 85 having a stepped portion 85a interposed therebetween. The outer heat insulating member 16b includes a plurality of laterally divided sections 90, 90 which are stacked in a multiple step with a respective boundary plane 86 having a stepped portion 86a interposed therebetween.

Figure 10:
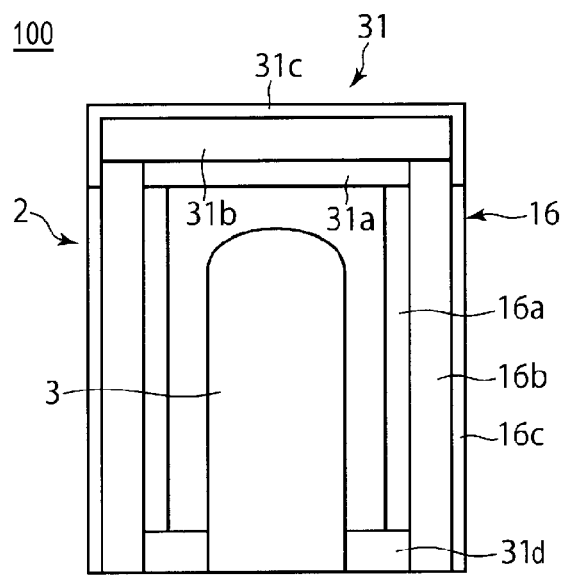
FIG. 10 is a longitudinal sectional view illustrating one modified heat treatment apparatus.

The following is a description of one modified heat treatment apparatus with reference to FIG. 10.

As shown in FIG. 10, a heat treatment apparatus 100 includes a heat treatment furnace 2 which is provided with a heat insulating member 16 and an upper heat insulating member 31 installed in an upper portion of the heat insulating member 16. In particular, the heat insulating member 16 includes an inner heat insulating member 16a made of a conventional heat insulating material, an outer heat insulating member 16b made of a finely-powdered compressed silica material, and an anti-scattering member 16c covering the outer surface of the outer heat insulating member 16b. Further, the upper heat insulating member 31 includes an upper inner heat insulating member 31a made of a conventional heat insulating material, an upper outer heat insulating member 31b made of a finely-powdered compressed silica material, and an anti-scattering member 31c covering the outer surface of the upper outer heat insulating member 31b. Moreover, a lower inner heat insulating member 31d that extends to the processing vessel 3 is disposed in a lower portion of the heat insulating member 16.

Figure 11:
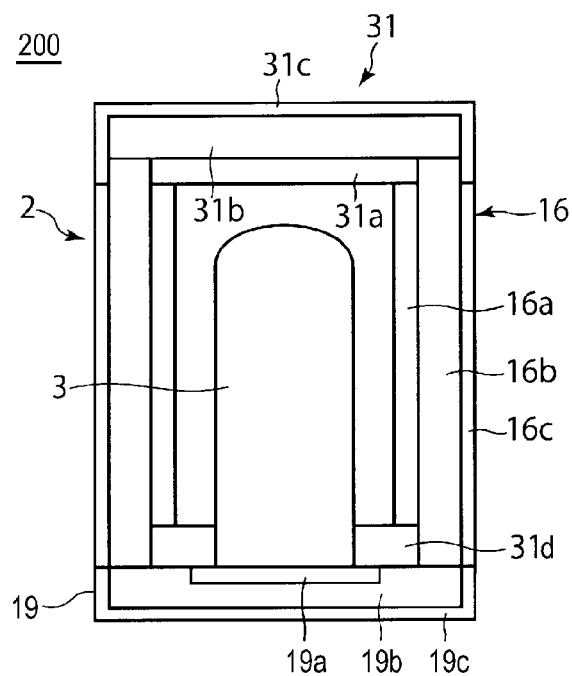
FIG. 11 is a longitudinal sectional view illustrating another modified heat treatment apparatus.

The following is a description of another modified example of the heat treatment apparatus with reference to FIG. 11.

As shown in FIG. 11, a heat treatment apparatus 200 includes a heat treatment furnace 2 which is provided with a heat insulating member 16 and an upper heat insulating member 31 installed in an upper portion of the heat insulating member 16. In particular, the heat insulating member 16 includes an inner heat insulating member 16a made of a conventional heat insulating material, an outer heat insulating member 16b made of a finely-powdered compressed silica material, and an anti-scattering member 16c covering the outer surface of the outer heat insulating member 16b. Further, the upper heat insulating member 31 includes an upper inner heat insulating member 31a made of a conventional heat insulating material, an upper outer heat insulating member 31b made of a finely-powdered compressed silica material, and an anti-scattering member 31c covering the outer surface of the upper outer heat insulating member 31b.

Moreover, a lower inner heat insulating member 31d that extends to the processing vessel 3 is disposed in a lower portion of the heat insulating member 16. Moreover, the lower portion of the processing vessel 3 is covered with a lid member 19. The lid member 19 includes an inner heat insulating member for lid member 19a made of a conventional heat insulating material, an outer heat insulating member for lid member 19b made of a finely-powdered compressed silica material, and an anti-scattering member for lid member 19c covering the outer surface of the outer heat insulating member for lid member 19b.

According to the present disclosure, a heat insulating member includes an inner heat insulating member, an outer heat insulating member made of a finely-powdered compressed silica material. Further, the outer surface of the outer heat insulating member is covered with an anti-scattering member for preventing scatter of the finely-powdered compressed silica material. Thus, use of the finely-powdered compressed silica material having a high heat insulation property minimizes the thickness of the heat insulating member. Moreover, it is possible to efficiently prevent the finely-powdered compressed silica material from being scattered to the exterior.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The various embodiments are not necessarily mutually exclusive as aspects of one embodiment can be combined with aspects of another embodiment. The accompanying claims and their equivalents are intended to cover such forms or modifications as would fall within the scope and spirit of the disclosures.

What is claimed is:

1. A heat treatment furnace, comprising:
   a processing vessel configured to accommodate at least one object to be processed;
   a heat insulating member configured to cover a periphery of the processing vessel; and
   a heating unit configured to be arranged along an inner peripheral surface of the heat insulating member,
   wherein the heat insulating member includes an inner heat insulating member and an outer heat insulating member formed independently of the inner heat insulating member, and
   wherein the outer heat insulating member contains a finely-powdered compressed silica material, and at least one outer surface of the outer heating insulating member is covered with an anti-scattering member configured to prevent the finely-powdered compressed silica material from being scattered.

2. The heat treatment furnace of claim 1, wherein the outer heat insulating member further contains a finely-powdered silicon carbide or a finely-powdered titania.

3. The heat treatment furnace of claim 1, wherein an outer shell is provided in an outside of the anti-scattering member to form at least one forcible cooling path between the outside of the anti-scattering member and the outer shell, and wherein at least one blowing hole through which a cooling medium flows is formed to pass through the anti-scattering member, the outer heat insulating member and the inner heat insulating member.

4. The heat treatment furnace of claim 1, wherein an inner surface of the outer heat insulating member is covered with the anti-scattering member to form at least one forcible cooling path between the inner heat insulating member and the anti-scattering member of the inner surface of the outer heat insulating member, and wherein at least one blowing hole for a cooling medium for forcible cooling is formed to pass through the inner heat insulating member.

5. The heat treatment furnace of claim 1, wherein the outer heat insulating member includes a plurality of longitudinally divided sections, which are adjacent to each other with a respective boundary plane interposed therebetween, and wherein each of the plurality of longitudinally divided sections has a rectangular shape.

6. The heat treatment furnace of claim 5, wherein the respective boundary plane extends radially.

7. The heat treatment furnace of claim 5, wherein the respective boundary plane extends in a radially inclined diametrical direction.

8. The heat treatment furnace of claim 5, wherein a filling member made of a finely-powdered compressed silica material is provided in the respective boundary plane.

9. The heat treatment furnace of claim 5, wherein the outer heat insulating member includes a plurality of cylindrical thin plates, each of the plurality of cylindrical thin plates is sequentially disposed from an inner surface to an outer surface of the outer heat insulating member in a multilayer shape, and wherein each of the plurality of cylindrical thin plates is formed by bending a flat-shaped thin plate.

10. The heat treatment furnace of claim 9, wherein each of the plurality of thin plates includes a plurality of longitudinally divided sections, which are adjacent to each other with a respective boundary plane interposed therebetween.

11. The heat treatment furnace of claim 3, wherein the at least one forcible cooling path includes a plurality of annular paths that are vertically partitioned by a partition member, and wherein each of the plurality of annular paths includes a respective blowing hole through which a forcible cooling medium flows.

12. The heat treatment furnace of claim 11, wherein a flow rate of the forcible cooling medium is controlled in each of the plurality of annular paths.

13. The heat treatment furnace of claim 11, wherein regions of the outer heat insulating member corresponding to the respective blowing hole are covered with the anti-scattering member.

14. The heat treatment furnace of claim 1, wherein a plurality of longitudinally-extended slits is formed on an inner peripheral surface of the inner heat insulating member.

15. The heat treatment furnace of claim 5, wherein the inner heat insulating member includes a plurality of longitudinally divided sections, which are adjacent to each other with a respective boundary plane interposed therebetween, and wherein the respective boundary plane of the inner heat insulating member and the respective boundary plane of the outer heat insulating member are out of position with respect to each other in a circumferential direction.

16. A heat treatment apparatus, comprising:
    a heat treatment furnace having a processing vessel configured to accommodate at least one object to be processed, a lower end of the heat treatment furnace defining a furnace opening;
    a lid member configured to close/open the furnace opening;
    a holding unit disposed on the lid member and configured to hold the at least one object to be processed in multiple stages; and
    an elevating mechanism configured to elevate the lid member and the holding unit in order to close and open the lid member and to carry in and out the processing vessel from the holding unit,
    wherein the heat treatment furnace further includes:
    a heat insulating member configured to cover a periphery of the processing vessel; and
    a heating unit configured to be arranged along an inner peripheral surface of the heat insulating member,
    wherein the heat insulating member includes an inner heat insulating member and an outer heat insulating member formed independently of the inner heat insulating member, and
    wherein the outer heat insulating member contains a finely-powdered compressed silica material, and at least an outer surface thereof is covered with an anti-scattering member configured to prevent the finely-powdered compressed silica material from being scattered.

* * * * *